US012640189B2

(12) United States Patent
Song

(10) Patent No.: US 12,640,189 B2
(45) Date of Patent: May 26, 2026

(54) BUFFER CHIP, SEMICONDUCTOR PACKAGE INCLUDING BUFFER CHIP AND MEMORY CHIP, AND MEMORY MODULE

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 62 days.

(21) Appl. No.: 18/494,614

(22) Filed: Oct. 25, 2023

(65) Prior Publication Data

US 2024/0249767 A1     Jul. 25, 2024

(30) Foreign Application Priority Data

| Jan. 19, 2023 | (KR) | .......................... | 10-2023-0008372 |
| Jan. 19, 2023 | (KR) | .......................... | 10-2023-0008375 |
| Jul. 5, 2023 | (KR) | .......................... | 10-2023-0087246 |

(51) Int. Cl.
| *G11C 7/10* | (2006.01) |
| *G11C 11/4093* | (2006.01) |
| *H10B 80/00* | (2023.01) |
| *H10W 90/00* | (2026.01) |

(52) U.S. Cl.
CPC .......... *G11C 11/4093* (2013.01); *H10B 80/00* (2023.02); *H10W 90/00* (2026.01); *H10W 90/754* (2026.01)

(58) Field of Classification Search
CPC ..... G11C 11/4093; H10B 80/00; H01L 25/18; H01L 2225/0651
USPC ................................................... 365/189.05
See application file for complete search history.

(56) References Cited

U.S. PATENT DOCUMENTS

| 5,754,764 | A | * | 5/1998 | Davis | .................... | G06F 13/385 |
| | | | | | | 709/200 |
| 7,177,211 | B2 | * | 2/2007 | Zimmerman | .......... | G11C 29/48 |
| | | | | | | 365/201 |
| 7,379,361 | B2 | | 5/2008 | Co et al. | | |
| 7,487,428 | B2 | * | 2/2009 | Co | ....................... | G06F 11/1044 |
| | | | | | | 714/763 |
| 8,275,936 | B1 | | 9/2012 | Haywood et al. | | |
| 8,447,908 | B2 | * | 5/2013 | Bruce | ..................... | G06F 13/36 |
| | | | | | | 710/308 |
| 9,264,368 | B2 | * | 2/2016 | Swarbrick | ............... | H04L 25/02 |
| 10,083,728 | B2 | * | 9/2018 | Luo | .......................... | G11C 8/12 |
| 10,522,209 | B2 | | 12/2019 | Benedict | | |
| 10,713,137 | B2 | | 7/2020 | Kim et al. | | |

(Continued)

FOREIGN PATENT DOCUMENTS

DE          102007009817 B4     8/2012

*Primary Examiner* — Viet Q Nguyen
(74) *Attorney, Agent, or Firm* — WILLIAM PARK AND ASSOCIATES LTD.

(57)          ABSTRACT

A buffer chip includes: an external control signal interface configured to receive control signals transmitted from a memory controller; an internal control signal interface configured to transmit the control signals to a plurality of memory chips; an external data interface configured to transmit and receive (transmit/receive) data to and from (to/from) the memory controller; an internal data interface configured to transmit/receive the data to/from the plurality of memory chips; and a loopback circuit configured to be activated in a loopback mode to receive the control signals transmitted by the internal control signal interface, and transmits the control signals to the external data interface.

11 Claims, 15 Drawing Sheets

(56) References Cited

U.S. PATENT DOCUMENTS

| | | | |
|---|---|---|---|
| 11,599,430 B2 | 3/2023 | Bradshaw et al. | |
| 12,009,023 B2 | 6/2024 | Wu et al. | |
| 12,198,784 B2 | 1/2025 | You et al. | |
| 12,405,748 B2 | 9/2025 | Lee | |
| 2005/0224948 A1 | 10/2005 | Lee et al. | |
| 2007/0201256 A1 | 8/2007 | RaghuRam | |
| 2008/0025137 A1 | 1/2008 | Rajan et al. | |
| 2009/0216939 A1 | 8/2009 | Smith et al. | |
| 2014/0181392 A1 | 6/2014 | Malladi et al. | |
| 2014/0189215 A1 | 7/2014 | Kang et al. | |
| 2014/0192583 A1 | 7/2014 | Rajan et al. | |
| 2015/0363287 A1 | 12/2015 | Dell et al. | |
| 2016/0147623 A1 | 5/2016 | Ping et al. | |
| 2017/0212848 A1 | 7/2017 | Sun et al. | |
| 2017/0277463 A1 | 9/2017 | Yoon | |
| 2018/0166105 A1 | 6/2018 | Choi et al. | |
| 2019/0171359 A1 | 6/2019 | Lee et al. | |
| 2019/0237152 A1* | 8/2019 | Lee | G11C 29/36 |
| 2019/0362804 A1 | 11/2019 | Kim | |
| 2021/0397570 A1 | 12/2021 | Ware et al. | |
| 2021/0407567 A1 | 12/2021 | Kim | |
| 2022/0238146 A1 | 7/2022 | Woo et al. | |
| 2023/0072674 A1 | 3/2023 | Vogelsang et al. | |
| 2023/0152840 A1* | 5/2023 | Zhang | G06F 1/10 |
| | | | 711/105 |
| 2024/0055068 A1* | 2/2024 | Bamdhamravuri | G11C 7/222 |
| 2024/0094762 A1* | 3/2024 | Zhang | G11C 11/4096 |
| 2024/0144984 A1* | 5/2024 | Morishita | G11C 29/50008 |
| 2024/0194227 A1 | 6/2024 | Wu et al. | |
| 2024/0249767 A1 | 7/2024 | Song | |
| 2024/0264947 A1 | 8/2024 | Kim | |
| 2024/0321831 A1 | 9/2024 | Shin et al. | |
| 2024/0420790 A1* | 12/2024 | Taylor | G11C 29/021 |

* cited by examiner

| | SEL<0> | SEL<1> | SEL<2> | SEL<3> |
|---|---|---|---|---|
| DQ<k> | M_CA<0> | M_CA<6> | M_CA<12> | M_CS<0> |
| DQ<k+1> | M_CA<1> | M_CA<7> | M_CA<13> | M_CS<1> |
| DQ<k+2> | M_CA<2> | M_CA<8> | M_CLK_t | M_CS<2> |
| DQ<k+3> | M_CA<3> | M_CA<9> | M_CLK_c | M_CS<3> |
| DQS_t | M_CA<4> | M_CA<10> | M_ALERT | |
| DQS_c | M_CA<5> | M_CA<11> | | |

FIG. 11

BUFFER CHIP, SEMICONDUCTOR PACKAGE INCLUDING BUFFER CHIP AND MEMORY CHIP, AND MEMORY MODULE

CROSS-REFERENCE TO RELATED APPLICATION

This application claims priority under 35 U.S.C. § 119(a) to Korean Patent Application No. 10-2023-0008372 filed on Jan. 19, 2023, Korean Patent Application No. 10-2023-0008375 filed on Jan. 19, 2023, and Korean Patent Application No. 10-2023-0087246 filed on Jul. 5, 2023, in the Korean Intellectual Property Office, which are incorporated herein by reference in its entirety.

BACKGROUND

1. Technical Field

Embodiments of the present disclosure generally relate to a semiconductor package, and more particularly, to a semiconductor package including a buffer chip and a memory chip, and a memory module including the semiconductor package including a buffer chip and a memory chip.

2. Related Art

Recently, as application fields utilizing artificial intelligence and big data increase, the amount of data to be processed is explosively increasing. Many computer systems (for example, data centers, servers, and the like) require a large amount of memory, and applications using the computer systems require a larger amount of memory than system capabilities. However, it is becoming increasingly difficult to add a memory to the computer system due to issues such as latency and bandwidths. Various methods for increasing the amount of a memory in a system while maintaining low latency and a high bandwidth are being studied.

SUMMARY

In an embodiment, a buffer chip may include: an external control signal interface configured to receive control signals transmitted from a memory controller; an internal control signal interface configured to transmit the control signals to a plurality of memory chips; an external data interface configured to transmit and receive data to/from the memory controller; an internal data interface configured to transmit and receive the data to/from the plurality of memory chips; and a loopback circuit that is activated in a loopback mode to receive the control signals transmitted by the internal control signal interface, and to transmit the control signals to the external data interface.

In an embodiment, a semiconductor package may include: a package substrate including a plurality of terminals configured to communicate with a memory controller and a plurality of bonding pads configured to communicate inside a package; a buffer chip stacked on the package substrate; a plurality of memory chips stacked on the buffer chip; and a plurality of wires connecting the plurality of bonding pads and the plurality of memory chips, wherein the buffer chip may communicate with the memory controller through the plurality of terminals of the package substrate, the plurality of memory chips may communicate with the buffer chip through the plurality of wires and the plurality of bonding pads of the package substrate, and the buffer chip may include: an external control signal interface configured to receive control signals transmitted from the memory controller; an internal control signal interface configured to transmit the control signals to the plurality of memory chips; an external data interface configured to transmit and receive data to/from the memory controller; an internal data interface configured to transmit and receive the data to/from the plurality of memory chips; and a loopback circuit configured to be activated in a loopback mode to receive the control signals transmitted by the internal control signal interface, and to transmit the control signals to the external data interface.

In an embodiment, a memory module may include: a module controller including a host interface for communication with a host, a memory controller logic configured to control memory, and a memory interface configured to transmit control signals and to transmit and receive data; a buffer chip configured to receive the control signals from the memory interface and transmit and receive the data to/from the memory interface; and a plurality of memory chips configured to receive the control signals through the buffer chip and transmit/receive the data through the buffer chip, wherein the buffer chip may include: an external control signal interface configured to receive control signals transmitted from the memory controller; an internal control signal interface configured to transmit the control signals to the plurality of memory chips; an external data interface configured to transmit and receive data to/from the memory controller; an internal data interface configured to transmit and receive the data to/from the plurality of memory chips; and a loopback circuit configured to be activated in a loopback mode to receive the control signals transmitted by the internal control signal interface, and to transmit the control signals to the external data interface.

In an embodiment, a buffer chip may include: an external control signal interface configured to receive control signals transmitted from a memory controller; an internal control signal interface configured to transmit the control signals to a plurality of memory chips through internal control nodes; an external data interface configured to transmit and receive data to/from the memory controller; an internal data interface configured to transmit and receive the data to/from the plurality of memory chips through internal data nodes; and a leakage test circuit configured to test leakage in nodes to be tested, which are at least one of the internal control nodes and the internal data nodes.

In an embodiment, a semiconductor package may include: a package substrate including a plurality of terminals configured to communicate with a memory controller and a plurality of bonding pads configured to communicate inside a package; a buffer chip disposed on the package substrate; a plurality of memory chips stacked on the buffer chip; and a plurality of wires connecting the plurality of bonding pads and the plurality of memory chips, wherein the buffer chip may include: an external control signal interface configured to receive control signals transmitted from the memory controller; an internal control signal interface configured to transmit the control signals to a plurality of memory chips through internal control nodes; an external data interface configured to transmit and receive data to/from the memory controller; an internal data interface configured to transmit and receive the data to/from the plurality of memory chips through internal data nodes; and a leakage test circuit configured to test leakage in nodes to be tested, which are at least one of the internal control nodes and the internal data nodes.

In an embodiment, a memory module may include: a module controller including a host interface for communication with a host, a memory controller logic configured to control memory, and a memory interface configured to transmit control signals and to transmit and receive data; a buffer chip configured to receive the control signals from the memory interface and to transmit and receive the data to/from the memory interface; and a plurality of memory chips configured to receive the control signals through the buffer chip and to transmit/receive the data through the buffer chip, wherein the buffer chip may include: an external control signal interface configured to receive control signals transmitted from the memory controller; an internal control signal interface configured to transmit the control signals to the plurality of memory chips through internal control nodes; an external data interface configured to transmit and receive data to/from the memory controller; an internal data interface configured to transmit and receive the data to/from the plurality of memory chips through internal data nodes; and a leakage test circuit configured to test leakage in nodes to be tested, which are at least one of the internal control nodes and the internal data nodes.

In an embodiment, an operation method of a buffer chip operating between a memory controller and a plurality of memory chips may include: receiving control signals from the memory controller; transmitting the control signals to a plurality of nodes connected to the plurality of memory chips; re-receiving the control signals of the plurality of nodes; and transmitting at least some of the re-received control signals to the memory controller.

In an embodiment, an operation method of a buffer chip operating between a memory controller and a plurality of memory chips may include: selecting a node to be tested for leakage among internal transmission nodes between the buffer chip and the plurality of memory chips; electrically connecting the node to be tested for leakage to one of external transmission nodes between the memory controller and the buffer chip; and driving nodes, other than the node to be tested for leakage among the internal transmission nodes, to the same voltage level.

BRIEF DESCRIPTION OF THE DRAWINGS

FIG. 3 is a configuration diagram of an embodiment of a buffer chip 220 in FIG. 2.

FIG. 9 is a configuration diagram of an embodiment of a loopback circuit 810 in FIG. 8.

FIG. 10 is a table showing an operation of the loopback circuit 810 in a loopback mode in which a loopback mode signal LPB_MODE is activated.

FIG. 11 is a configuration diagram of further another embodiment of the buffer chip 220 in FIG. 2.

DETAILED DESCRIPTION

Various embodiments are directed to reducing loading due to an increase in a memory while increasing the capacity of a memory.

Various embodiments of the present disclosure can reduce loading due to an increase in memory while increasing the capacity of a memory.

Hereafter, embodiments in accordance with the technical spirit of the present disclosure will be described with reference to the accompanying drawings.

Figure 1:
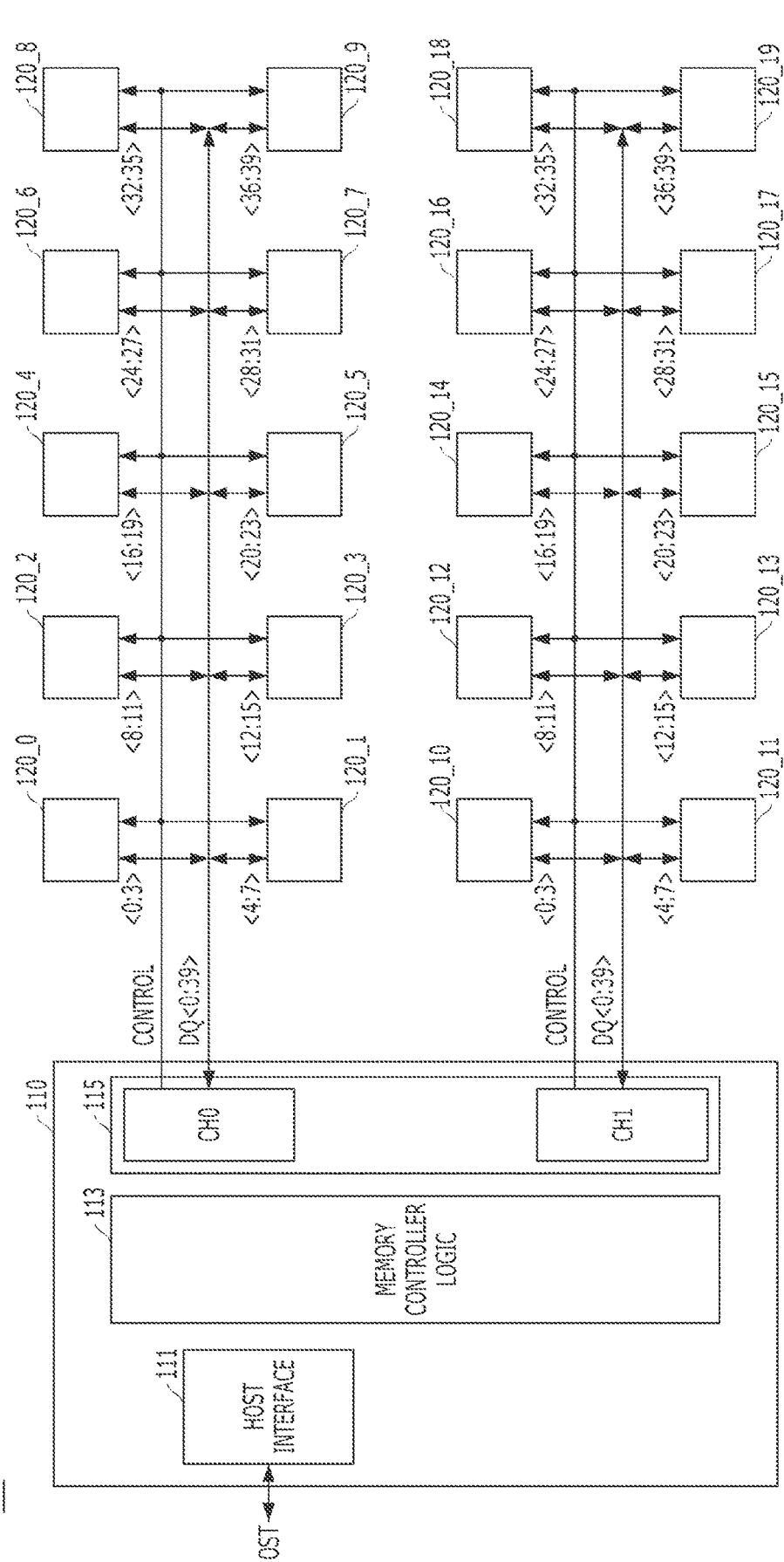
FIG. 1 is a configuration diagram of a memory module 100 in accordance with an embodiment.

FIG. 1 is a configuration diagram of a memory module 100 in accordance with an embodiment.

Referring to FIG. 1, the memory module 100 may include a module controller 110 and memory packages 120_0 to 120_19.

The module controller 110 may include a host interface 111, a memory controller logic 113, and a memory interface 115. The memory controller logic 113 and the memory interface 115 are also referred to as a memory controller.

The host interface 111 may be used for communication between the module controller 110 and a host HOST (computer system). The host interface 111 may be a compute express link (CXL) interface. The CXL interface is an interface based on peripheral component interconnect express (PCIe), and may be an interface made so that a central processing unit (CPU), a graphic processing unit (GPU), and various types of accelerators more efficiently use a memory and the like. By connecting the memory module 100 to the host HOST through the CXL interface, the memory capacity of a computer system such as a data center and a server can be increased, and various processors in the computer system can share the memory.

The memory controller logic 113 may be a logic for controlling the memory packages 120_0 to 120_19, and the memory interface 115 may be an interface for communication with the memory packages 120_0 to 120_19. The memory interface 115 may include two channels CH0 and CH1. Ten memory packages 120_0 to 120_9 may be connected to the channel CH0 of the memory interface 115, and ten memory packages 120_10 to 120_19 may be connected to the channel CH1.

The channel CH0 of the memory interface 115 may be connected to the memory packages 120_0 to 120_9 through 40 data lines DQ<0:39>. Four different data lines may be connected to the memory packages 120_0 to 120_9. For example, four data lines DQ<0:3> may be connected to the memory package 120_0, and four data lines DQ<4:7> may be connected to the memory package 120_1.

The channel CH0 of the memory interface 115 may be connected to the memory packages 120_0 to 120_9 through control signal transmission lines CONTROL. The control signal transmission lines CONTROL may include a plurality of lines, and may be common to the memory packages 120_0 to 120_9. For example, all of the control signal transmission lines CONTROL may be connected to the memory package 120_0 and may also be connected to the memory package 120_1. Although not illustrated in the drawing, lines for transmitting clocks and data strobe signals may be further connected between the channel CH0 of the memory interface 115 and the memory packages 120_0 to 120_9.

The channel CH1 of the memory interface 115 and the memory packages 120_10 to 120_19 may be connected in the same way as the channel CH0 and the memory packages 120_0 to 120_9.

Each of the memory packages 120_0 to 120_19 may include one or more memory chips (for example, DRAM chips). In an embodiment, because one of the important reasons for using the memory module 100 is to greatly increase the capacity of a memory, it is desirable that each of the memory packages 120_0 to 120_19 includes a plurality of memory chips. As one of methods of putting a plurality of memory chips into a memory package, a method such as 3 dimensional stacking (3DS) has been used. The 3DS method may use a through-silicon via (TSV) for communication between memory chips in a memory package. However, when a memory package is manufactured in this way, the price of the memory package may increase because a lot of time and cost are required in packaging.

In the memory module 100 in accordance with an embodiment of the present disclosure, each of the memory packages 120_0 to 120_19 may include a buffer chip and a plurality of memory chips. The buffer chip may perform a buffer operation between the module controller 110 and the plurality of memory chips. The plurality of memory chips included in each of the memory packages 120_0 to 120_19 may be connected to the buffer chip through wire bonding. The memory module 100 may increase a memory capacity by using the plurality of memory chips and reduce loading due to an increase in memory by using a buffer chip.

However, the configuration of the memory packages 120_0 to 120_19 disclosed in the present specification is merely an example and might not be limited thereto. For example, each of the memory packages 120_0 to 120_19 may include different types of memory chips. For example, at least one of the memory packages 120_0 to 120_19 may have a different configuration from other memory packages and/or may be connected to the module controller 110 in a different way. For example, memory chips included in at least one of the memory packages 120_0 to 120_19 may be integrated using a 3 dimensional stacking (3DS) method, a monolithic 3D (M3D) method, or the like. For example, memory chips included in at least one of the memory packages 120_0 to 120_19 may communicate with each other by using through-silicon vias (TSVs) or vias with a smaller size and higher density than the TSVs.

The form factor of the memory module 100 may have various forms such as an add-in-card (AIC) and an enterprise and data center SSD form factor (EDSFF).

Figure 2:
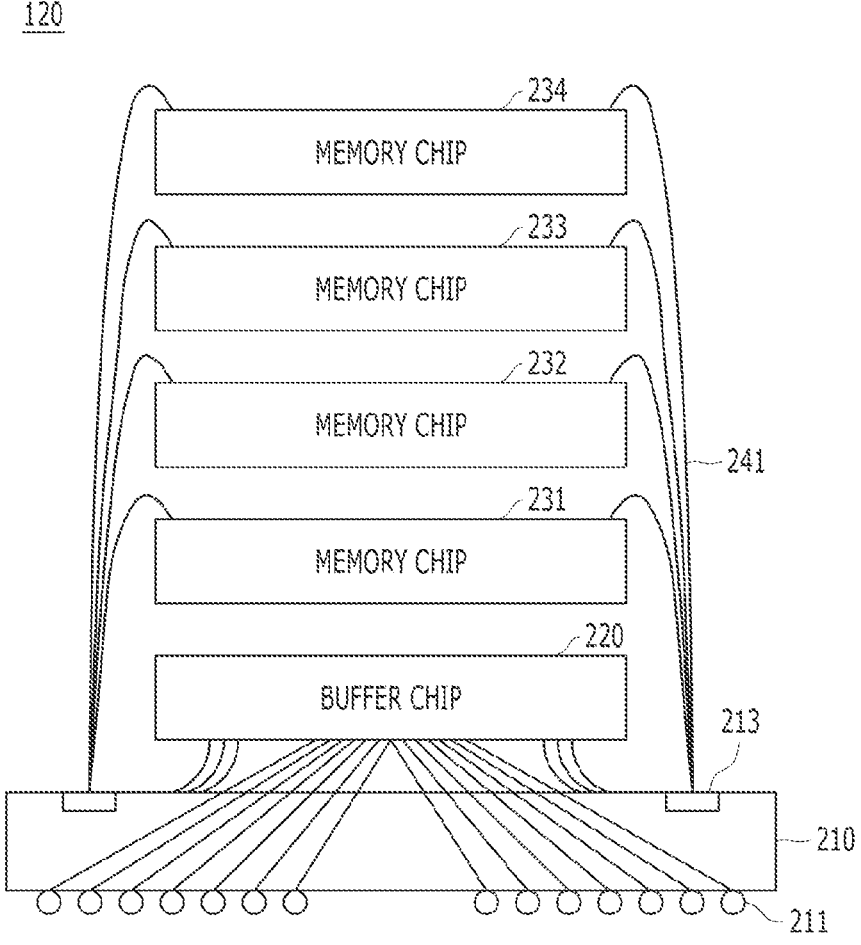
FIG. 2 is a configuration diagram of an embodiment of a memory package 120 in FIG. 1.

FIG. 2 is a configuration diagram of an embodiment of the memory package 120 in FIG. 1.

Referring to FIG. 2, the memory package 120 may include a package substrate 210, a buffer chip 220, and a plurality of memory chips 231 to 234.

The package substrate 210 may include a plurality of package balls 211 that are terminals for communication with the memory interface 115 (FIG. 1) and a plurality of bonding pads 213 for communication inside the memory package 120.

The buffer chip 220 may be disposed on the package substrate 210. The buffer chip 220 may communicate with the memory interface 115 (FIG. 1) through the package balls 211 of the package substrate 210. The buffer chip 220 may further communicate with the memory chips 231 to 234 through the bonding pads 213 of the package substrate 210.

The memory chips 231 to 234 may be stacked on the buffer chip 220, and may communicate with the buffer chip 220 through wires 241 connecting the bonding pads 213 and the memory chips 231 to 234. The memory chips 231 to 234 may communicate with the memory interface 115 (FIG. 1) through the buffer chip 220. The control signals CONTROL (FIG. 1) and the data DQ<0:39> (FIG. 1) transmitted from the memory interface 115 (FIG. 1) may be transmitted to the buffer chip 220 through the package balls 211, buffered, and then transmitted from the buffer chip 220 to the memory chips 231 to 234 through the bonding pads 213. Data transmitted from the memory chips 231 to 234 may be transmitted to the buffer chip 220 through the bonding pads 213, buffered, and then transmitted to the memory interface 115 (FIG. 1) through the package balls 211.

In an embodiment, because only the buffer chip 220 among the chips of the memory package 120 may be connected to the memory interface 115 (FIG. 1), loading between the memory package 120 and the memory interface 115 (FIG. 1) may be reduced to enable a high-speed operation. In an embodiment, because the buffer chip 220 and the memory chips 231 to 234 are connected through wiring instead of a TSV that consumes a lot of cost in a manufacturing process, the manufacturing cost of the memory package 120 may be reduced.

Figure 3:
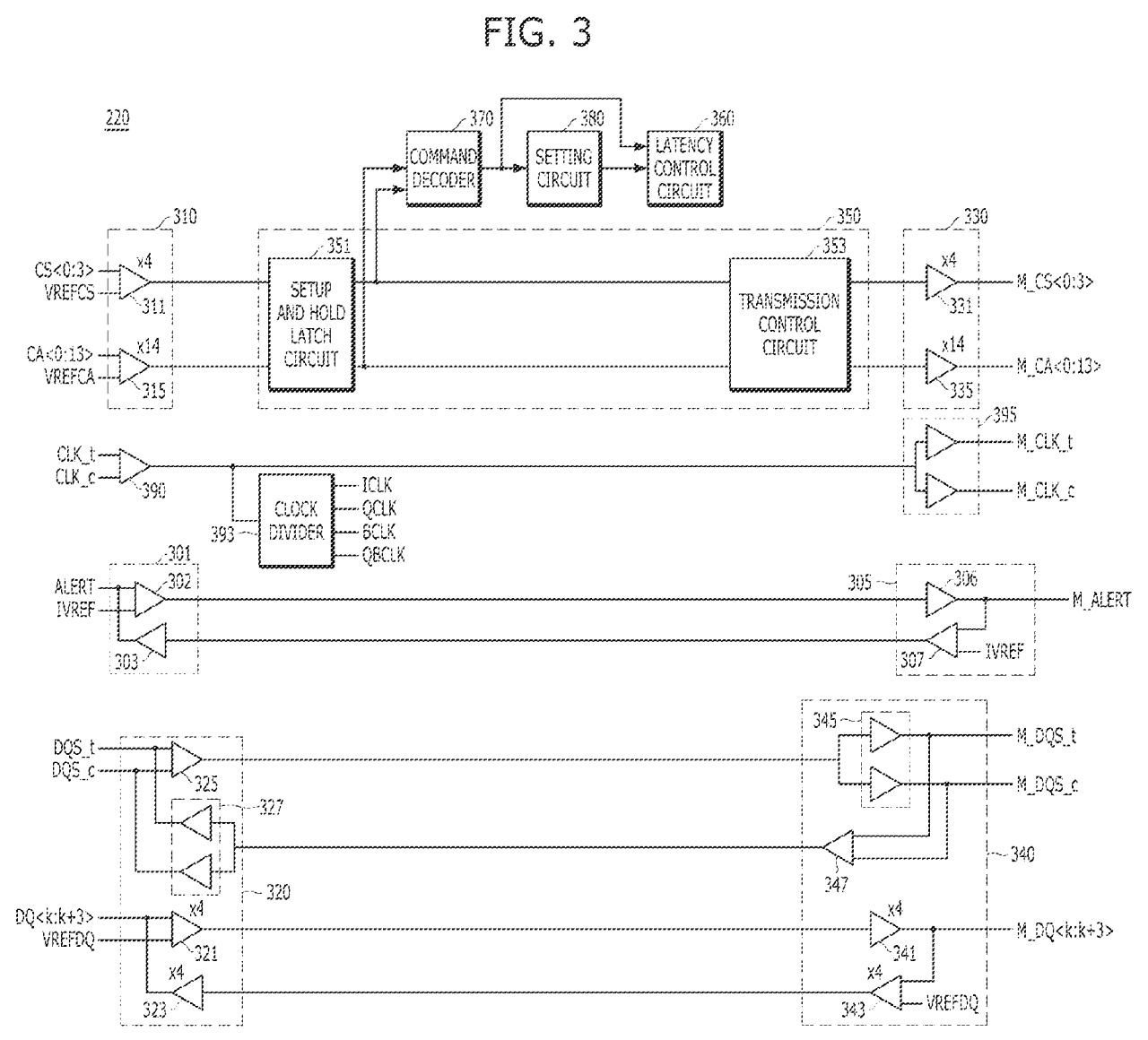

FIG. 3 is a configuration diagram of an embodiment of the buffer chip 220 in FIG. 2.

Referring to FIG. 3, the buffer chip 220 may include an external control signal interface 310, an external data interface 320, an internal control signal interface 330, an internal data interface 340, a control signal transmission circuit 350, a latency control circuit 360, a command decoder 370, a setting circuit 380, a clock reception circuit 390, a clock divider 393, a clock transmission circuit 395, an external alert signal interface 301, and an internal alert signal interface 305.

The external control signal interface 310 may receive the control signals CONTROL (FIG. 1) transmitted from the memory interface 115 (FIG. 1). The control signals CONTROL (FIG. 1) may include chip select signals CS<0:3> and command address signals CA<0:13>. The external control signal interface 310 may include a chip select signal reception circuit 311 and a command address reception circuit 315.

The chip select signals CS<0:3> are used for distinguishing the memory chips 231 to 234 (FIG. 2) in the memory package 120 (FIG. 2), that is, for distinguishing ranks, and the number of chip select signals CS<0:3> may be the same as the number of the memory chips 231 to 234 (FIG. 2) in the memory package 120 (FIG. 2). In FIG. 3, because the number of chip select signals CS<0:3> is illustrated as 4, the chip selection reception circuit 311 may include four reception buffers. Buffers of the chip select signal reception circuit 311 may receive the chip select signals CS<0:3> by comparing voltage levels of the chip selection reference voltage VREFCS and the chip select signals CS<0:3> with each other.

The command address reception circuit 315 may include the same number of reception buffers as the number of command address signals CA<0:13>. In FIG. 3, because the number of command address signals CA<0:13> is illustrated as 14, the command address reception circuit 315 may include 14 reception buffers. Buffers of the command address reception circuit 315 may receive the command address signals CA<0:13> by comparing voltage levels of a command address reference voltage VREFCA and the command address signals CA<0:13> with each other.

The external data interface 320 may transmit and receive (transmit/receive) data DQ<k:k+3> (K is an integer equal to or greater than 0) to/from the memory interface 115 (FIG. 1). The external data interface 320 may transmit/receive not only the data DQ<k:k+3> but also data strobe signals DQS_t and DQS_c for strobing the data DQ<k:k+3>. The external data interface 320 may include an external data reception circuit 321, an external data transmission circuit 323, an external data strobe reception circuit 325, and an external data strobe transmission circuit 327.

The external data reception circuit 321 may include the same number of reception buffers as the number of terminals to which the data DQ<k:k+3> are input. Because FIG. 3 four data terminals are provided for each memory package 120 (FIG. 2), the external data reception circuit 321 may include four reception buffers. Buffers of the external data reception circuit 321 may receive the data DQ<k:k+3> by comparing voltage levels of the data reference voltage VREFDQ and the data DQ<k:k+3> with each other.

The external data strobe reception circuit 325 may receive the data strobe signals DQS_t and DQS_c transmitted from the memory interface 115 (FIG. 1), together with the data DQ<k:k+3>. Because the data strobe signals DQS_t and DQS_c are differential-type signals, the external data strobe reception circuit 325 may include a reception buffer that compares voltage levels of a positive data strobe signal DQS_t and a negative data strobe signal DQS_c with each other and receives them.

The external data transmission circuit 323 may transmit the data DQ<k:k+3>. The external data transmission circuit 323 may include four transmission drivers.

The external data strobe transmission circuit 327 may transmit the data strobe signals DQS_t and DQS_c for strobing the data DQ<k:k+3> transmitted by the external data transmission circuit 323. The external data strobe transmission circuit 327 may include two transmission drivers.

The clock reception circuit 390 may receive clocks CLK_t and CLK_c transmitted from the memory interface 115 (FIG. 1). Because the clocks CLK_t and CLK_c are differential-type signals, the clock reception circuit 390 may include a reception buffer that compares voltage levels of the regular clock CLK_t and the secondary clock CLK_c and receives them.

The clock divider 393 may divide the clocks CLK_t and CLK_c received by the clock reception circuit 390. First to fourth clocks ICLK, QCLK, BCLK, and QBCLK generated by the clock divider 393 may each have a frequency of half the frequency of each of the clocks CLK_t and CLK_c, and may have different phases. The clocks CLK_t and CLK_c received by the clock reception circuit 390 and the first to fourth clocks ICLK, QCLK, BCLK, and QBCLK generated by the clock divider 393 may be used by various components inside the buffer chip 220.

The control signal transmission circuit 350 may buffer the control signals received through the external control signal interface 310, and transmit the buffered control signals to the internal control signal interface 330. The control signal transmission circuit 350 may include a setup and hold latch circuit 351 for securing a setup hold margin and a transmission control circuit 353 performing a buffering operation.

The internal control signal interface 330 may transmit control signals M_CS<0:3> and M_CA<0:13> transmitted through the control signal transmission circuit 350 to the memory chips 231 to 234 (FIG. 2). The command address signals M_CA<0:13> may be transmitted in common to the memory chips 231 to 234 (FIG. 2), and the chip select signals M_CS<0:3> may be transmitted to the memory chips 231 to 234 (FIG. 2) in a one-to-one manner. That is, the chip select signal M_CS<0> may be transmitted to the memory chip 231 (FIG. 2), the chip select signal M_CS<1> may be transmitted to the memory chip 232 (FIG. 2), the chip select signal M_CS<2> may be transmitted to the memory chip 233 (FIG. 2), and the chip select signal M_CS<3> may be transmitted to the memory chip 234 (FIG. 2).

The internal control signal interface 330 may include a chip select signal transmission circuit 331 and a command address transmission circuit 335. Because the number of chip select signals M_CS<0:3> is 4, the chip select signal transmission circuit 331 may include four transmission drivers. Also, because the number of command address signals M_CA<0:13> is 14, the command address transmission circuit 335 may include 14 transmission drivers.

The internal data interface 340 may transmit/receive data M_DQ<k:k+3> to/from the memory chips 231 to 234 (FIG. 2). The data M_DQ<k:k+3> may be connected in common to the memory chips 231 to 234 (FIG. 2). When the data M_DQ<k:k+3> is transmitted in common to the memory chips 231 to 234 (FIG. 2) during a write operation, a memory chip selected to perform a write operation among the memory chips 231 to 234 (FIG. 2) may receive the data M_DQ<k:k+3> transmitted by the internal data interface 340. During a read operation, a memory chip selected to perform a read operation among the memory chips 231 to 234 may transmit the data M_DQ<k:k+3> to the internal data interface 340. The internal data interface 340 may transmit/receive not only the data M_DQ<k:k+3> but also the data strobe signals M_DQS_t and M_DQS_c for strobing the data M_DQ<k:k+3> to/from the memory chips 231 to 234 (FIG. 2).

The internal data interface 340 may include an internal data transmission circuit 341, an internal data reception circuit 343, an internal data strobe transmission circuit 345, and an internal data strobe reception circuit 347. The internal data transmission circuit 341 may include four transmission drivers, and the internal data reception circuit 343 may include four reception buffers. The internal data strobe transmission circuit 345 may include two transmission drivers, and the internal data strobe reception circuit 347 may include one reception buffer.

The clock transmission circuit 395 may transmit the clocks M_CLK_t and M_CLK_c to the memory chips 231 to 234 (FIG. 2). The clocks M_CLK_t and M_CLK_c may be transmitted in common to the memory chips 231 to 234 (FIG. 2). The clock transmission circuit 395 may include two transmission drivers.

The command decoder 370 may decode the chip select signals CS<0:3> and the command address signals CA<0:13> received through the external control signal interface 310. The command decoder 370 may receive and decode control signals latched by the setup and hold latch circuit 351 after being received by the external control signal interface 310. The chip select signals CS<0:3> indicate the validity of the command address signals CA<0:13>, and when even one of the four chip select signals CS<0:3> is activated to a low level, the command decoder 370 of the buffer chip 220 may determine that the command address signals CA<0:13> are valid and decode the command address signals CA<0:13>.

The setting circuit 380 may perform a setting operation according to the decoding result of the command decoder 370. Setting items of the setting circuit 380 may include a read latency of the buffer chip 220, a write latency of the buffer chip 220, levels of reference voltages used by the buffer chip 220, a termination resistance value (also referred to as Rtt) of the buffers of the buffer chip 220, a termination resistance value (also referred to as Ron) of the drivers of the buffer chip 220, an equalizing coefficient (for example, a coefficient of decision feedback equalization) of the buffer chip 220, a command rate, and the like.

The latency control circuit 360 may control whether to activate the external data interface 320 and the internal data interface 340. The latency control circuit 360 may activate the external data reception circuit 321 and the internal data transmission circuit 341 so that the data DQ<k:k+3> transmitted from the memory interface 115 (FIG. 1) to the buffer chip 220 may be received after a write latency set by the setting circuit 380 from the time point when a write command is applied to the buffer chip 220 and transmitted to the memory chips 231 to 234. The latency control circuit 360 may further activate the internal data reception circuit 343 and the external data transmission circuit 323 so that data DQ<k:k+3> buffered after being received from the memory chips 231 to 234 (FIG. 2) may be transmitted from the buffer chip 220 to the memory interface 115 (FIG. 1) after a read latency set by the setting circuit 380 from the time point when a read command is applied to the buffer chip 220. The latency control circuit 360 may activate the external data strobe reception circuit 325 and the internal data strobe transmission circuit 345 during the write operation and activate the internal data strobe reception circuit 347 and the external data strobe transmission circuit 327 during the read operation so that the data strobe signals DQS_t and DQS_c may also be transmitted and received together with the data DQ<k:k+3>. The latency control circuit 360 may receive information indicating that the read command and the write command have been applied to the buffer chip 220 from the command decoder 370, and receive information related to the read latency and the write latency from the setting circuit 380.

The external alert signal interface 301 may transmit an alert signal ALERT to the memory interface 115 or receive an alert signal ALERT from the memory interface 115. The external alert signal interface 301 may include an external alert signal reception circuit 302 and an external alert signal transmission circuit 303. The external alert signal reception circuit 302 may include a reception buffer that receives the alert signal ALERT by comparing voltage levels of a reference voltage IVREF and the alert signal ALERT with each other. The external alert signal transmission circuit 303 may include a driver for transmitting the alert signal ALERT to the memory interface 115.

The internal alert signal interface 305 may transmit an alert signal M_ALERT to the memory chips 231 to 234 or receive an alert signal M_ALERT from the memory chips 231 to 234. The internal alert signal interface 305 may include an internal alert signal transmission circuit 306 and an internal alert signal reception circuit 307. The internal alert signal transmission circuit 306 may include a driver for transmitting the alert signal M_ALERT to the memory chips 231 to 234. The internal alert signal reception circuit 306 may include a reception buffer that receives the alert signal M_ALERT by comparing voltage levels of the reference voltage IVREF and the alert signal M_ALERT with each other.

However, the configuration of the buffer chip 220 might not be limited to that illustrated in FIG. 3. For example, the buffer chip 220 may further include an additional circuit for improving the quality of a test operation. In a test mode of the buffer chip 220 in accordance with an embodiment of the present disclosure, the buffer chip 220 and the memory chips 231 to 234 may have to perform different operations. For example, the buffer chip 220 may block at least one of command signals transmitted from the buffer chip 220 to the memory chips 231 to 234 or use a dedicated command for the buffer chip 220 to execute a test mode for the buffer chip 220 regardless of operations of the memory chips 231 to 234.

Figure 4:
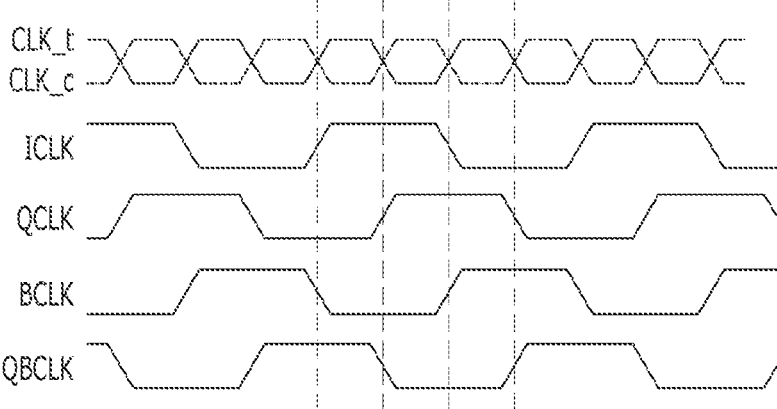
FIG. 4 is a diagram illustrating first to fourth clocks ICLK, QCLK, BCLK, and QBCLK generated by a clock divider 390 in FIG. 3.

FIG. 4 is a diagram illustrating the first to fourth clocks ICLK, QCLK, BCLK, and QBCLK generated by the clock divider 393 in FIG. 3.

Referring to FIG. 4, the first to fourth clocks ICLK, QCLK, BCLK, and QBCLK generated by the clock divider 393 may each have a frequency of half the frequency of each of the clocks CLK_t and CLK_c, and may have a phase difference of 90° among the first to fourth clocks ICLK, QCLK, BCLK, and QBCLK.

Figure 5:
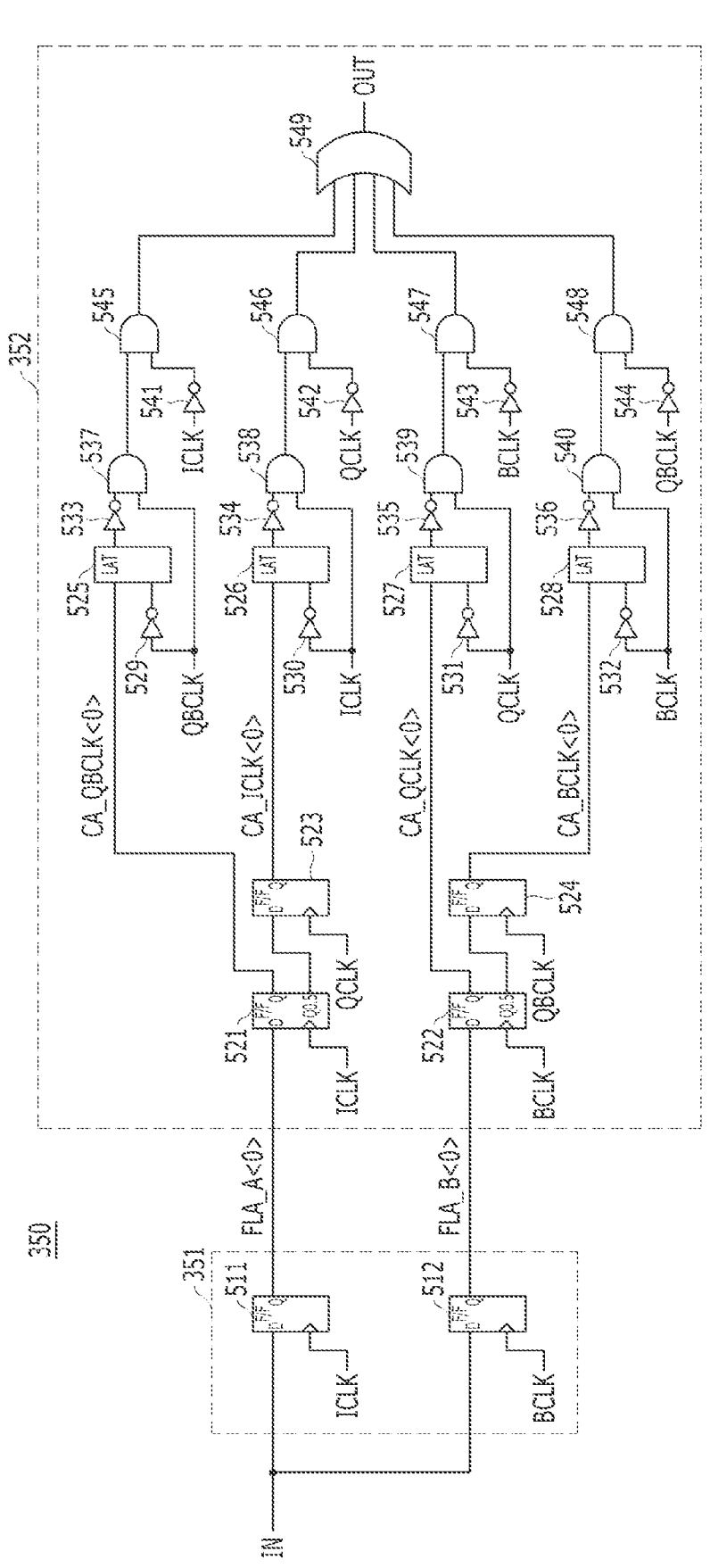
FIG. 5 is a configuration diagram of an embodiment of a control signal transmission circuit 350 in FIG. 3.
Figure 6:
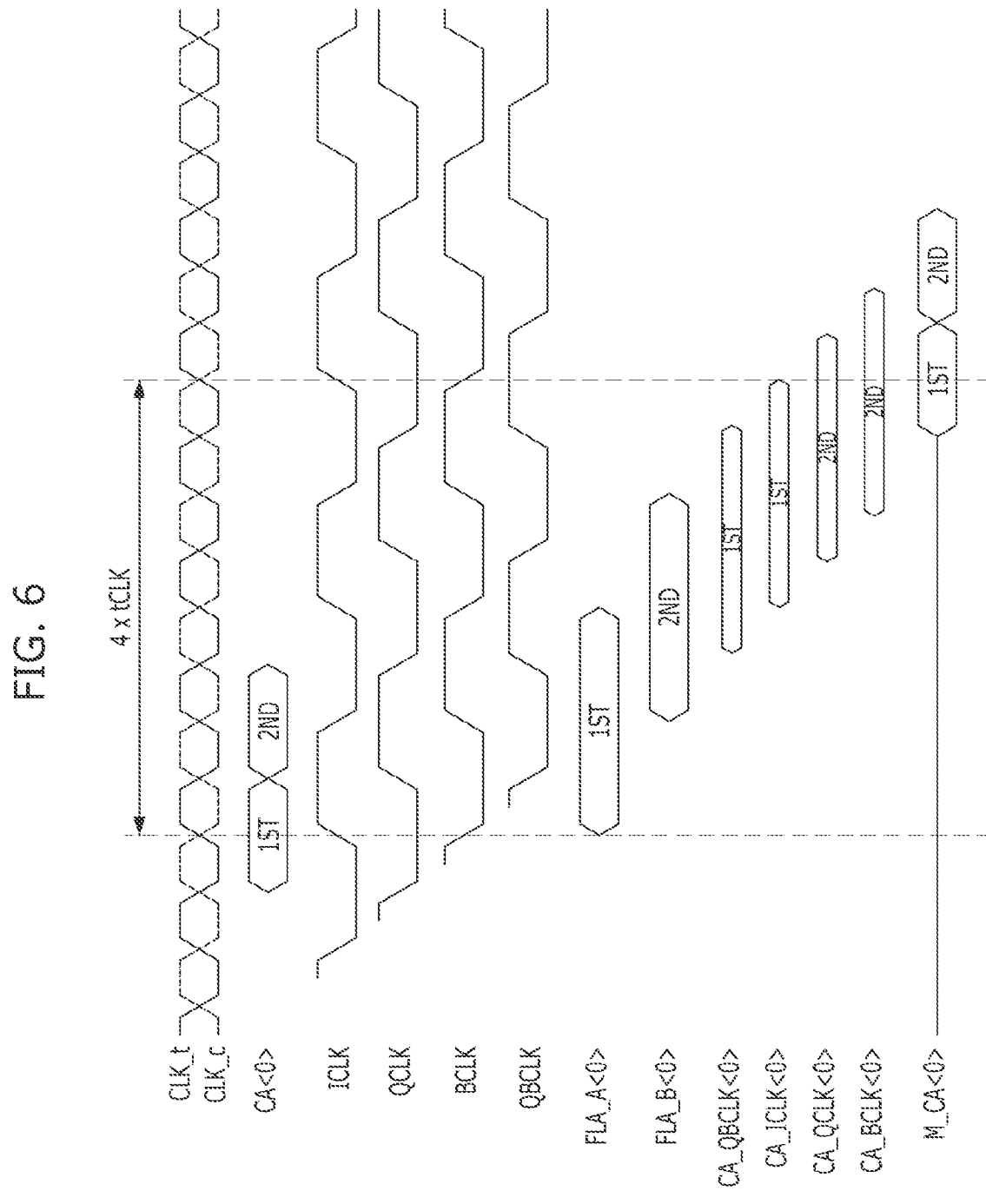
FIG. 6 is, an embodiment of, an operation timing diagram of the control signal transmission circuit 350 in FIG. 5.

FIG. 5 is a configuration diagram of an embodiment of the control signal transmission circuit 350 in FIG. 3, and FIG. 6 is an operation timing diagram of the control signal transmission circuit 350. FIG. 5 illustrates components for transmitting the command address signal CA<0> in the control signal transmission circuit 350. The remaining control signals CA<1:13> and CS<0:3> may also be transmitted in the same way as the command address signal CA<0>.

Referring to FIG. 5, the setup and hold latch circuit 351 of the control signal transmission circuit 350 may include D flip-flops 511 and 512. An input IN of the D flip-flops 511 and 512 may be an output of a buffer of the command address reception circuit 315 in FIG. 3, which receives the command address signal CA<0>. The D flip-flop 511 may receive an input at a rising edge of a first clock ICLK, latch the received input, and output a signal FLA_A<0>, and the D flip-flop 512 may receive an input at a rising edge of a third clock BCLK, latch the received input, and output a signal FLA_B<0>. Referring to FIG. 6 together, a signal 1ST of a first cycle of the command address signal CA<0> may be latched by the D flip-flop 511 and output as the signal FLA_A<0>, and a signal 2ND of a second cycle of the command address signal CA<0> may be latched by the D flip-flop 512 and output as the signal FLA_B<0>.

The transmission control circuit 353 of the control signal transmission circuit 350 may include D flip-flops 521 to 524, D latches 525 to 528, inverters 529 to 536 and 541 to 544, AND gates 537 to 540 and 545 to 548, and an OR gate 549.

Figure 7:
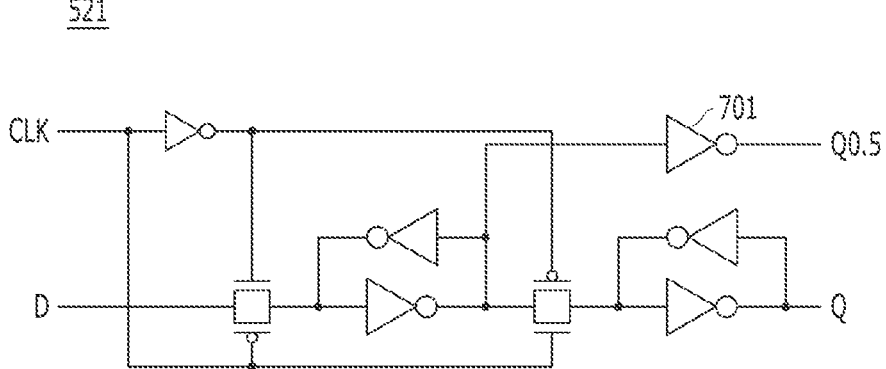
FIG. 7 is, an embodiment of, a diagram illustrating an internal configuration of a D flip-flop 521.

The D flip-flop 521 may receive and latch the signal FLA_A<0> at the rising edge of the first clock ICLK. A signal output as an output Q of the D flip-flop 521 is indicated by CA_QBCLK<0>. An output Q0.5 of the D flip-flop 521 may be an output of a first stage of the D flip-flop 521 including two stages. FIG. 7 illustrates the internal configuration of the D flip-flop 521, and the D flip-flop 521 may further include an inverter 701 for outputting the output Q0.5 from a latch of the first stage in addition to the configuration of a general D flip-flop. The D flip-flop 523 may receive and latch the output Q0.5 of the D flip-flop 521 at a rising edge of the second clock QCLK, and output the latched output as a signal CA_ICLK<0>. Referring to FIG. 6, the signals CA_QBCLK<0> and CA_ICLK<0> may have a phase difference equal to a phase difference between the first clock ICLK and the second clock QCLK.

The D flip-flop 522 may receive and latch the signal FLA_B<0> at the rising edge of the third clock BCLK. A signal output as an output Q of the D flip-flop 522 is indicated by CA_QCLK<0>. The D flip-flop 524 may receive and latch an output Q0.5 of the D flip-flop 522 at a rising edge of the fourth clock QBCLK, and output the latched output as a signal CA_BCLK<0>. Referring to FIG. 6, the signals CA_QCLK<0> and CA_BCLK<0> may have a phase difference equal to a phase difference between the third clock BCLK and the fourth clock QBCLK.

The D latch 525 may latch and output the signal CA_QBCLK<0> while the fourth clock QBCLK is at a low level, an output of the D latch 525 may be inverted by the inverter 533, and an output of the inverter 533 and the fourth clock QBCLK may be input to the AND gate 537. An output of the AND gate 537 may be input to the AND gate 545 together with the first clock ICLK inverted by the inverter 541.

The D latch 526 may latch and output the signal CA_ICLK<0> while the first clock ICLK is at a low level, an output of the D latch 526 may be inverted by the inverter 534, and an output of the inverter 534 and the first clock ICLK may be input to the AND gate 538. An output of the AND gate 538 may be input to the AND gate 546 together with the second clock QCLK inverted by the inverter 542.

The D latch 527 may latch and output the signal CA_QCLK<0> while the second clock QCLK is at a low level, an output of the D latch 527 may be inverted by the inverter 535, and an output of the inverter 535 and the second clock QCLK may be input to the AND gate 539. An output of the AND gate 539 may be input to the AND gate 547 together with the third clock BCLK inverted by the inverter 543.

The D latch 528 may latch and output the signal CA_BCLK<0> while the third clock BCLK is at a low level, an output of the D latch 528 may be inverted by the inverter 536, and an output of the inverter 536 and the third clock BCLK may be input to the AND gate 540. An output of the AND gate 540 may be input to the AND gate 548 together with the fourth clock QBCLK inverted by the inverter 544.

Outputs of the AND gates 545 to 548 may be input to the OR gate 549, and an output OUT of the OR gate 549 may be an input of a driver of the command address transmission circuit 335 in FIG. 3, which transmits the command address signal M_CA<0>.

Referring to FIG. 6, the command address signal CA<0> received from the memory interface 115 (FIG. 1) by the command address reception circuit 315 of the buffer chip 220 may be buffered by the control signal transmission circuit 350, delayed by 4 clock cycles based on the clocks CLK_t and CLK_c, and transmitted to the memory chips 231 to 234 (FIG. 2) by the command address transmission circuit 335.

Referring now back to FIG. 2, in an embodiment, because the buffer chip 220 is packaged with the memory chips 231 to 234, when a failure occurs in an operation after the packaging, it is difficult to ascertain whether the operation failure is due to the buffer chip 220, the memory chips 231 to 234, or other problems inside the package. For example, when a failure occurs in a read operation, it is difficult to check whether the buffer chip 220 has failed to properly transmit control signals to the memory chips 231 to 234, whether there is a problem in wirings inside the package 120, or whether there is a problem in the memory chips 231 to 234.

Figure 8:
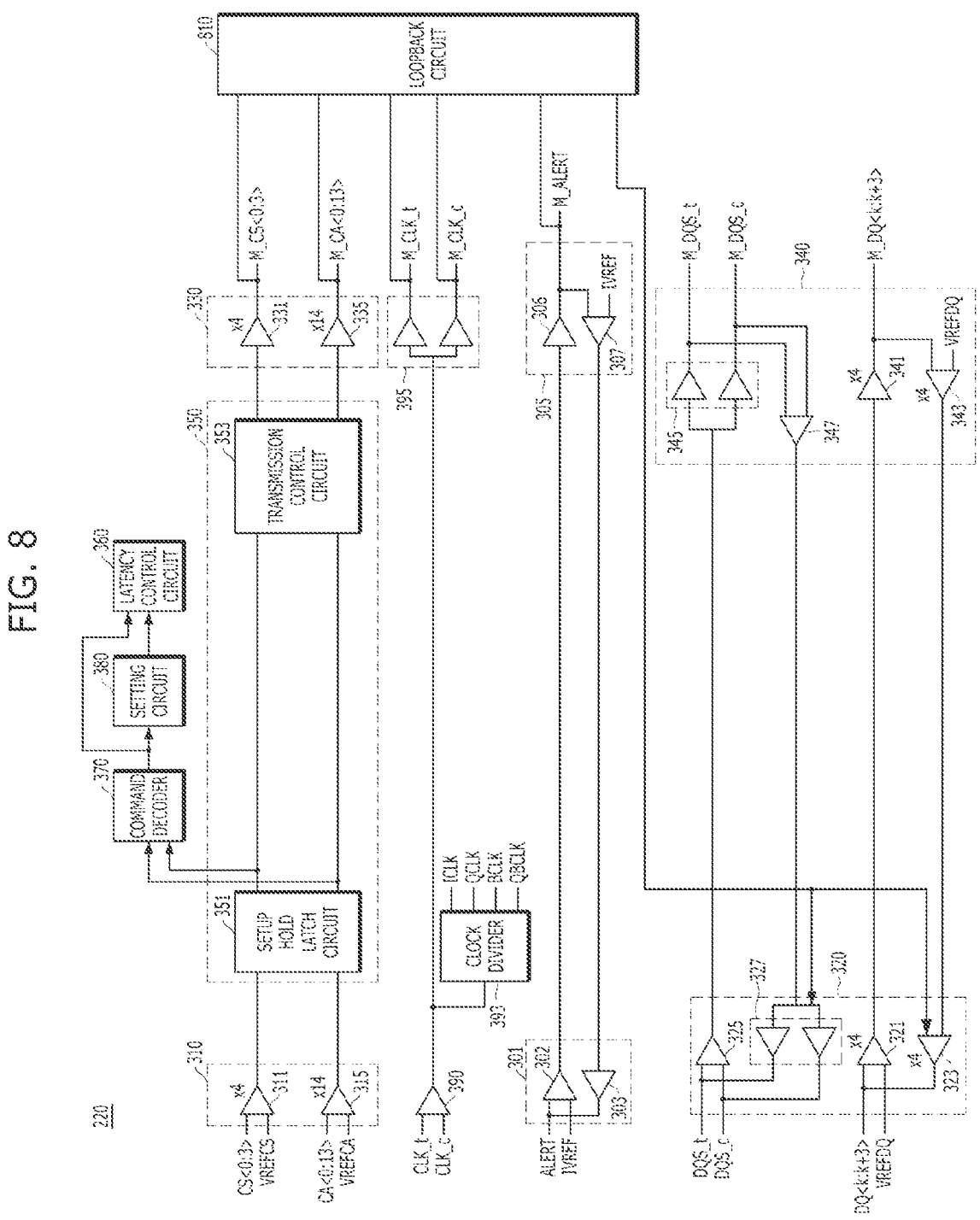
FIG. 8 is a configuration diagram of another embodiment of the buffer chip 220 in FIG. 2.

FIG. 8 is a configuration diagram of another embodiment of the buffer chip 220 in FIG. 2. In FIG. 8, an embodiment in which it is possible to check defects in the buffer chip 220 by looping back control signals transmitted by the buffer chip 220 will be described.

Referring to FIG. 8, the buffer chip 220 may include the external control signal interface 310, the external data interface 320, the internal control signal interface 330, the internal data interface 340, the control signal transmission circuit 350, the latency control circuit 360, the command decoder 370, the setting circuit 380, the clock reception circuit 390, the clock divider 393, the clock transmission circuit 395, the external alert signal interface 301, the internal alert signal interface 305, and a loopback circuit 810.

The buffer chip 220 may set a loopback mode in order to check whether signals are correctly transmitted to the memory chips 231 to 234. For example, the loopback mode may be set by the setting circuit 380.

The loopback circuit 810 may be activated in the loopback mode, and may receive the signals M_CS<0:3> and M_CA<0:13> transmitted by the internal control signal interface 330, the clocks M_CLK_t and M_CLK_c transmitted by the clock transmission circuit 395, and the alert signal M_ALERT transmitted by the internal alert signal interface 305, and transmit the received signals to the external data interface 320, thereby outputting the signals to the outside of the buffer chip 220 through the transmission circuits 323 and 327 of the external data interface 320. Accordingly, the memory controller outside the buffer chip 220 may check whether the buffer chip 220 correctly transmits signals to the memory chips 231 to 234. The loopback mode may also be used during a manufacturing process of the buffer chip 220 and the memory package 120, and may also be used by a user or the like even after the memory package 120 is manufactured. During the manufacturing process, test equipment may operate as a memory controller.

FIG. 8 illustrates that the buffer chip 220 includes one latency control circuit 360, one setting circuit 380, and one command decoder 370; however, this is for convenience of explanation and the present disclosure might not be limited thereto. For example, the buffer chip 220 may perform a setting operation for each rank by including a plurality of at least one of the components included in the buffer chip 220.

Figure 9:
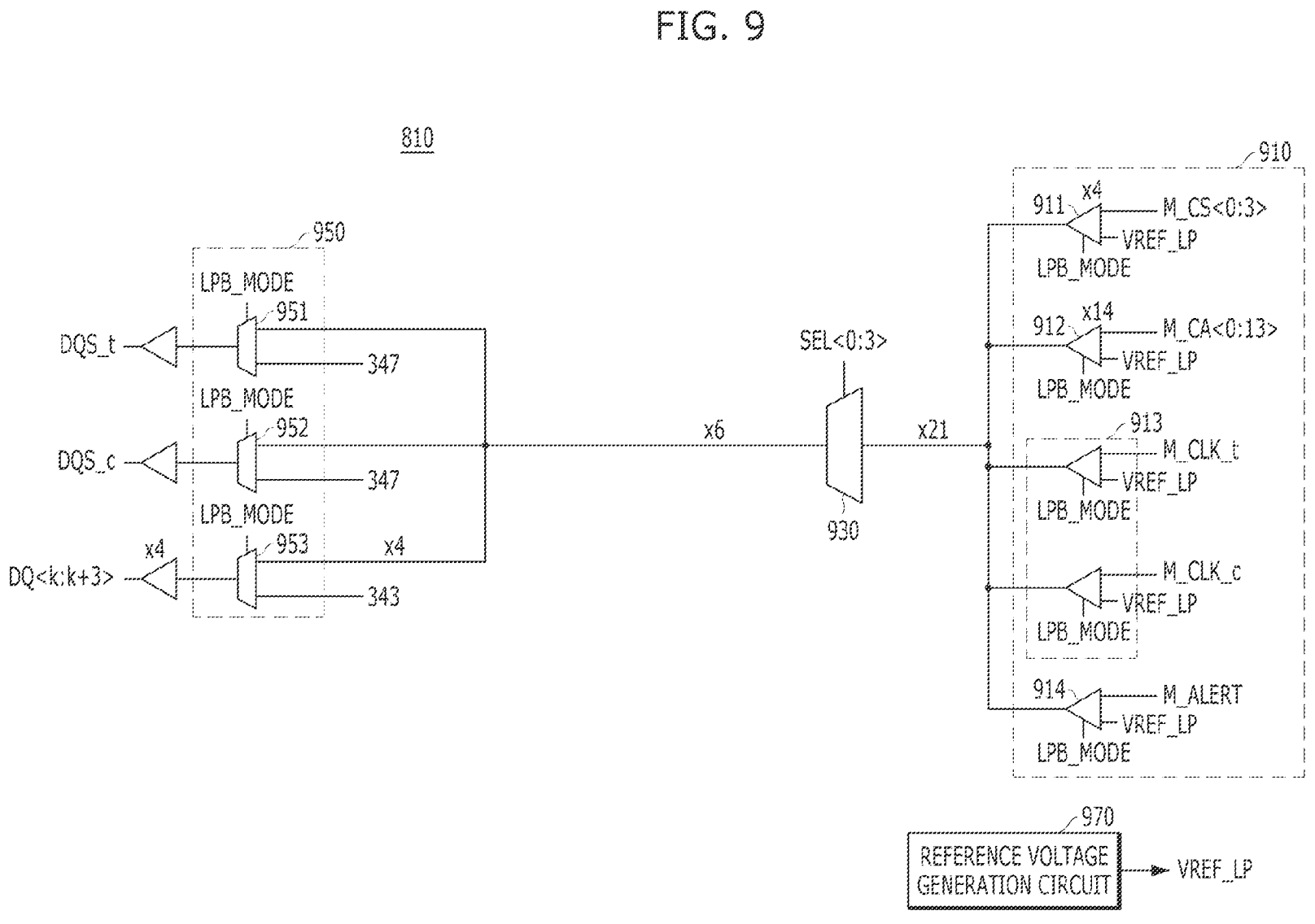

FIG. 9 is a configuration diagram of an embodiment of the loopback circuit 810 in FIG. 8. FIG. 9 also illustrates peripheral configurations of the loopback circuit 810.

Referring to FIG. 9, the loopback circuit 810 may include a loopback reception circuit 910, a loopback selection circuit 930, a mode control circuit 950, and a reference voltage generation circuit 970. A loopback mode signal LPB_MODE and selection signals SEL<0:3> are signals for controlling the operation of the loopback mode, and may be generated by the setting circuit 380 according to a decoding result of the command decoder 370.

The loopback reception circuit 910 may include four buffers 911 for receiving the chip select signals M_CS<0:3> transmitted by the chip select signal transmission circuit 331, 14 buffers 912 for receiving the command address signals M_CA<0:13> transmitted by the command address transmission circuit 335, two buffers 913 for receiving the clocks M_CLK_t and M_CLK_c transmitted by the clock transmission circuit 395, and a buffer 914 for receiving the alert signal M_ALERT transmitted by the internal alert signal transmission circuit 306. The reference voltage generation circuit 970 may generate a reference voltage VREF_LP to be used by the buffers 911 to 914 to receive the signals. The buffers 911 to 914 of the loopback reception circuit 910 may be activated when the loopback mode signal LPB_MODE, which is a signal activated in the loopback mode, is activated, and may be deactivated when the loopback mode signal LPB_MODE is deactivated. FIG. 9 illustrates that the buffers 911 to 914 use one reference voltage VREF_LP; however, the buffers 911 to 914 may also use various reference voltages. Furthermore, some or all of the buffers 911 to 914 may also be configured as buffers of a type that does not use a reference voltage, for example, a CMOS type buffer.

The loopback selection circuit 930 may select signals to be output to the memory controller through the external data interface 320 among the 21 signals M_CS<0:3>, M_CA<0:13>, M_CLK_t, M_CLK_c, and M_ALERT received by the loopback reception circuit 910. Because the external data interface 320 can output 6 signals at once, the loopback selection circuit 930 can select maximum six signals according to levels of the selection signals SEL<0:3>. The selection operation of the loopback selection circuit 930 may be understood with reference to FIG. 10.

When the loopback mode signal LPB_MODE is activated, the mode control circuit 950 may transmit signals transmitted from the loopback selection circuit 930 to the external data transmission circuit 323 and the external data strobe transmission circuit 327. When the loopback mode signal LPB_MODE is deactivated, the mode control circuit 950 may transmit signals received by the internal data interface 340 to the external data transmission circuit 323 and the external data strobe transmission circuit 327. The mode control circuit 950 may include selection circuits 951 to 953 that perform a selection operation in response to a level of the loopback mode signal LPB_MODE.

FIG. 10 is a table showing an operation of the loopback circuit 810 in the loopback mode in which the loopback mode signal LPB_MODE is activated.

Referring to FIG. 10, it can be seen that when the selection signal SEL<0> is activated, six signals M_CA<0:5> may be output through the external data transmission circuit 323 and the external data strobe transmission circuit 327, and when the selection signal SEL<1> is activated, six signals M_CA<6:11> may be output through the external data transmission circuit 323 and the external data strobe transmission circuit 327. It can be seen that when the selection signal SEL<2> is activated, five signals M_CA<12:13>, M_CLK_t, M_CLK_c, and ALERT may be output through the external data transmission circuit 323 and the external data strobe transmission circuit 327, and when the selection signal SEL<3> is activated, four signals CS<0:3> may be output through the external data transmission circuit 323.

In an embodiment, tt can be seen that when the selection signals SEL<0:3> are sequentially activated in the loopback mode, the signals M_CS<0:3>, M_CA<0:13>, M_CLK_t, M_CLK_c, and M_ALERT can be looped back for output, so that it is possible to check whether the buffer chip 220 properly transmits the signals M_CS<0:3>, M_CA<0:13>, M_CLK_t, M_CLK_c, and M_ALERT.

Figure 11:
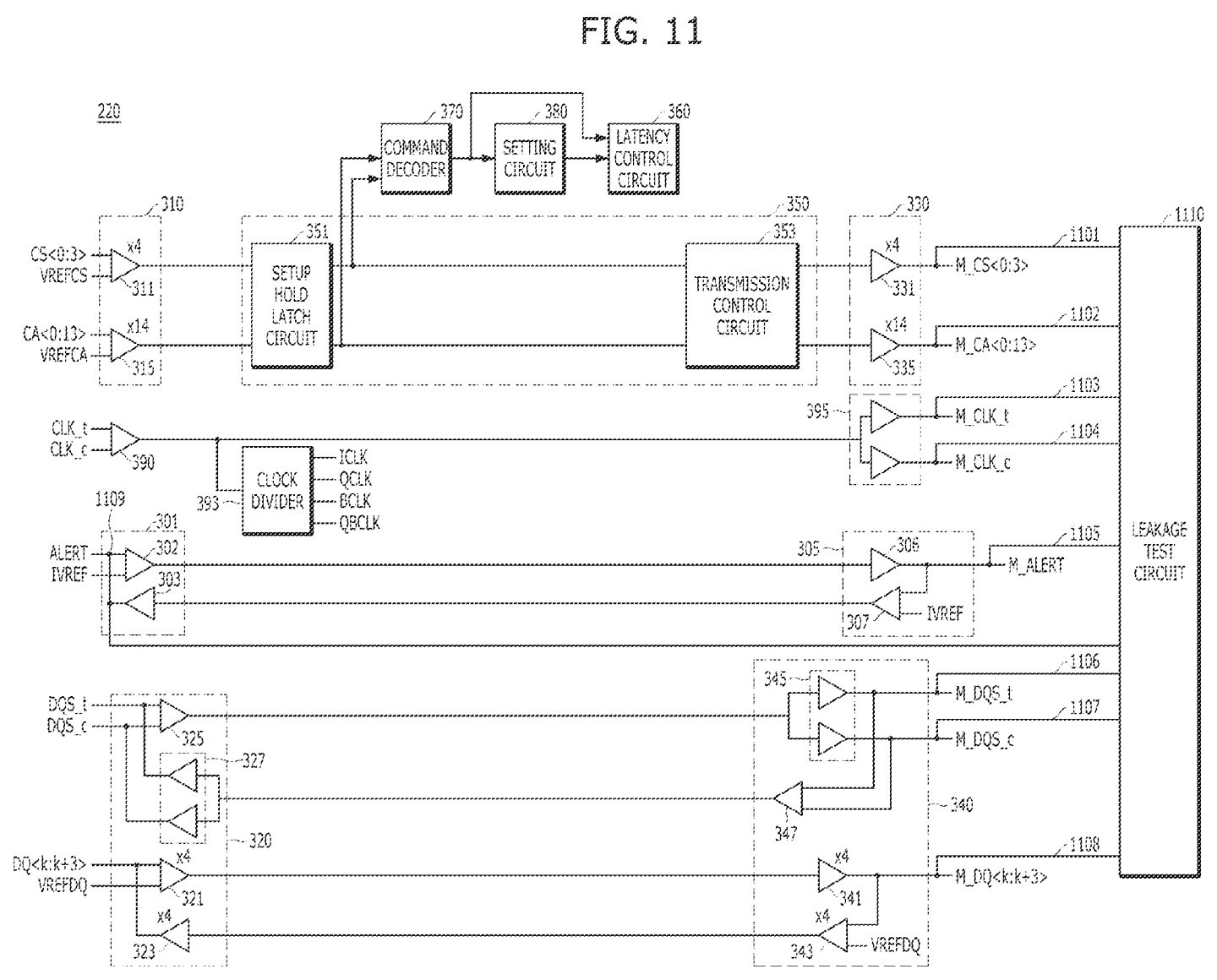

FIG. 11 is a configuration diagram of another embodiment of the buffer chip 220 in FIG. 2. In FIG. 11, an embodiment in which the buffer chip 220 can check whether there is a leakage path due to a short circuit between nodes for communication with the memory chips 231 to 234 will be described.

Referring to FIG. 11, the buffer chip 220 may include the external control signal interface 310, the external data interface 320, the internal control signal interface 330, the internal data interface 340, the control signal transmission circuit 350, the latency control circuit 360, the command decoder 370, the setting circuit 380, the clock reception circuit 390, the clock divider 393, the clock transmission circuit 395, the external alert signal interface 301, the internal alert signal interface 305, and a leakage test circuit 1110.

In FIG. 11, reference numeral 1101 may indicate four nodes from which four signals M_CS<0:3> are output, and reference numeral 1102 may indicate fourteen nodes from which fourteen signals M_CA<0:13> are output. Each of reference numerals 1103 to 1108 may indicate one or more nodes for outputting corresponding signals.

The leakage test circuit 1110 may perform a leakage test operation of the nodes 1101 to 1108 through which the buffer chip 220 communicates with the memory chips 231 to 234. The leakage test circuit 1110 may perform an operation for detecting leakage of the nodes 1101 to 1108 and output the operation result to the outside of the buffer chip 220 through an output node 1109. In FIG. 11, the output node 1109 through which a leakage test result is output is illustrated as a node 1109 through which the buffer chip 220 exchanges the alert signal ALERT with the memory controller. In FIG. 11, a node through which the buffer chip 220 exchanges the alert signal ALERT with the memory controller is illustrated as the output node 1109; however, this is merely an example and the present disclosure might not be limited thereto. For example, at least one of nodes through which the buffer chip 220 exchanges other signals with the memory controller may also be used as an output node.

The leakage test circuit 1110 operates in a leakage test mode, and the leakage test mode is a mode for testing whether a leakage path exists in the nodes 1101 to 1108 of the buffer chip 220 and may be set by the setting circuit 380.

Figure 12:
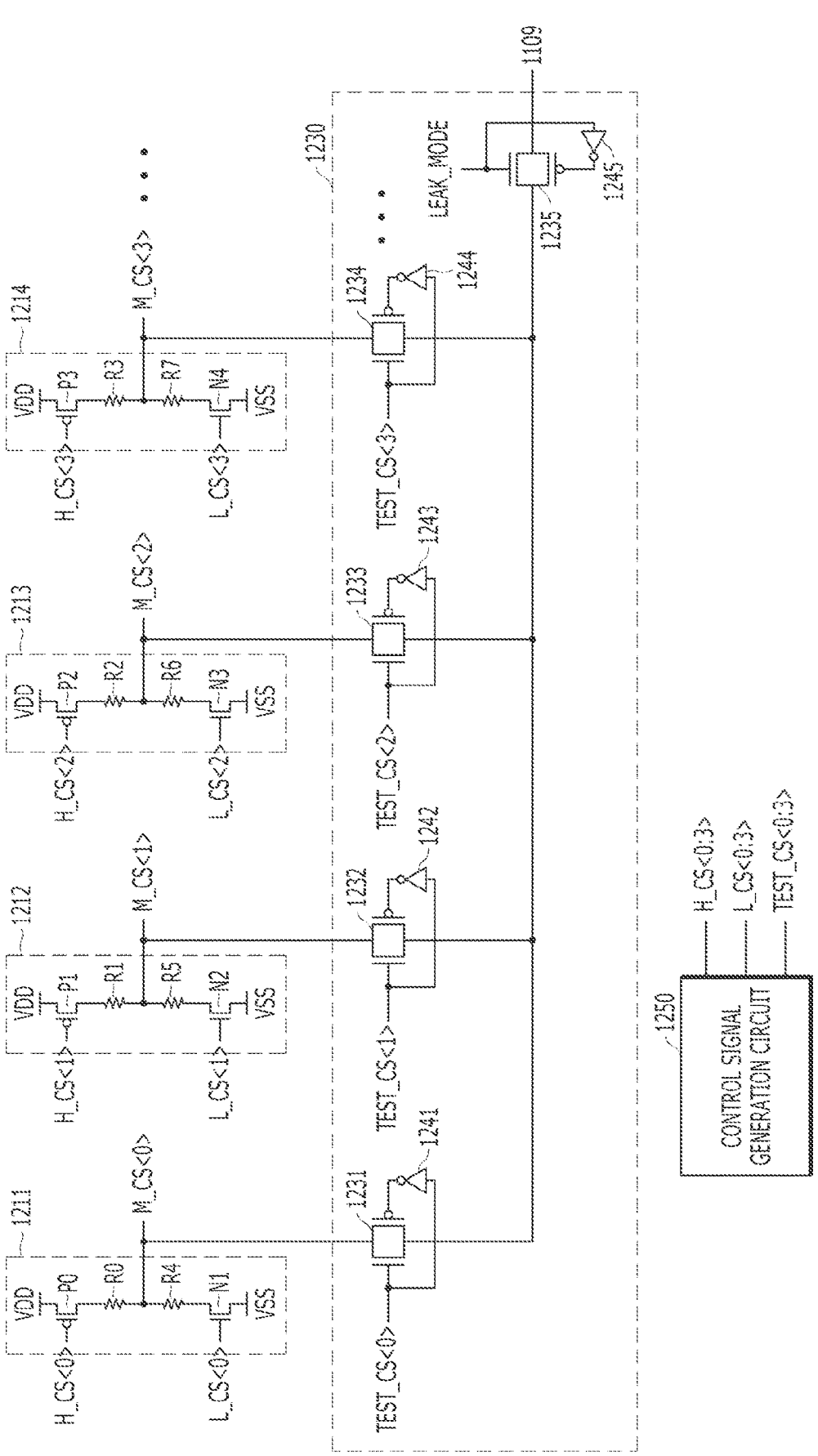
FIG. 12 is a configuration diagram of an embodiment of a leakage test circuit 1110 in FIG. 11.

FIG. 12 is a configuration diagram of an embodiment of the leakage test circuit 1110 in FIG. 11. For convenience of explanation, FIG. 12 illustrates only a portion of the leakage test circuit 1110 for testing leakage in the four nodes 1101 (nodes through which four signals M_CS<0:3> are output).

Referring to FIG. 12, the leakage test circuit 1110 may include voltage application circuits 1211 to 1214, a connection circuit 1230, and a control signal generation circuit 1250.

Each of the voltage application circuits 1211 to 1214 may apply a set voltage to the nodes M_CS<0:3> to which the voltage application circuits 1211 to 1214 correspond. The voltage application circuits 1211 to 1214 may float a node selected from the nodes M_CS<0:3> and apply a set voltage to the remaining nodes. For example, during a leakage test of the node M_CS<2>, the voltage application circuit 1213 may float the node M_CS<2>, and the voltage application circuits 1211, 1212, and 1214 may apply a high level voltage to the nodes M_CS<0>, M_CS<1>, and M_CS<3>. Because FIG. 12 illustrates a portion for testing leakage in four nodes 1101 (four nodes through which M_CS<0:3> are output), the four voltage application circuits 1211 to 1214 are illustrated; however, the number of the voltage application circuits 1211 to 1214 may be equal to the number of nodes to be tested of the leakage test circuit 1110.

The voltage application circuits 1211 to 1214 may be controlled by pull-up voltage control signals H_CS<0:3> and pull-down voltage control signals L_CS<0:3>. When the pull-up voltage control signals H_CS<0:3> are activated to a low level, the voltage application circuits 1211 to 1214 may drive the nodes M_CS<0:3> to a high level by using a power supply voltage VDD, and when the pull-down voltage control signals L_CS<0:3> are activated to a high level, the voltage application circuits 1211 to 1214 may drive the nodes M_CS<0:3> to a low level by using a ground voltage VSS. The voltage application circuits 1211 to 1214 may include PMOS transistors P0 to P3 and resistors R0 to R3 for pull-up driving the nodes M_CS<0:3> in response to the pull-up voltage control signals H_CS<0:3>, and NMOS transistors N0 to N3 and resistors R4 to R7 for pull-down driving the nodes M_CS<0:3> in response to the pull-down voltage control signals L_CS<0:3>. For example, when the pull-up voltage control signal H_CS<1> is activated to a low level, the PMOS transistor P1 may be turned on and the node M_CS<1> may be pulled-up driven by the PMOS transistor P1 and the resistor R1. When the pull-down voltage control signal L_CS<2> is activated to a high level, the NMOS transistor N2 may be turned on and the node M_CS<2> may be pulled-down driven by the NMOS transistor N2 and the resistor R6.

The connection circuit 1230 may control connections between the nodes M_CS<0:3> and the output node 1109. The connection circuit 1230 may electrically connect a node selected from the nodes to the output node 1109 and electrically separate the remaining nodes from the output node 1109.

The connection circuit 1230 may be controlled by signals TEST_CS<0:3> and LEAK_MODE. The node selection signals TEST_CS<0:3> are signals for selecting a node to be connected to the output node 1109 among the nodes M_CS<0:3>, and the leakage mode signal LEAK_MODE may be a signal for connecting the selected node to the output node 1109. The leak mode signal LEAK_MODE may be activated in the leak test mode. The connection circuit 1230 may include pass gates 1231 to 1235 and inverters 1241 to 1245. The pass gates 1231 to 1234 may be turned on/off in response to the node selection signals TEST_CS<0: 3>, and the pass gate 1235 may be turned on/off in response to the leakage mode signal LEAK_MODE.

The control signal generation circuit 1250 may generate the signals H_CS<0:3>, L_CS<0:3>, and TEST_CS<0:3> for controlling the voltage application circuits 1211 to 1214 and the connection circuit 1230. The control signal generation circuit 1250 may generate the signals H_CS<0:3>, L_CS<0:3>, and TEST_CS<0:3> so that a node selected for test among the nodes M_CS<0:3> may be floated, a voltage with a level selected from a high level or a low level may be applied to the remaining nodes, the selected node may be electrically connected to the output node 1109, and the remaining nodes may be electrically separated from the output node 1109.

Figure 13:
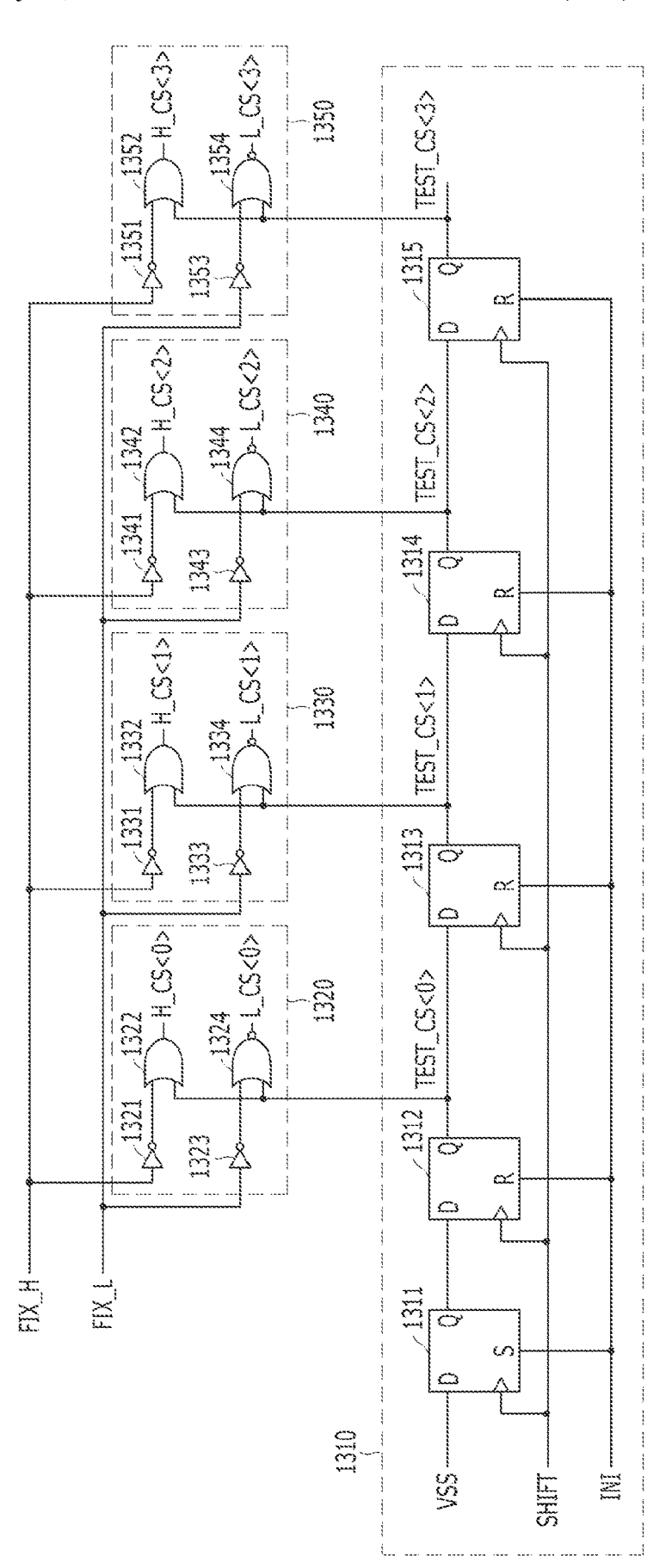
FIG. 13 is a configuration diagram of an embodiment of a control signal generation circuit 1250 in FIG. 12.

FIG. 13 is a configuration diagram of an embodiment of the control signal generation circuit 1250 in FIG. 12.

Referring to FIG. 13, the control signal generation circuit 1250 may include a shift unit 1310 and voltage control signal generation units 1320, 1330, 1340 and 1350.

The shift unit 1310 may generate the node selection signals TEST_CS<0:3>. The shift unit 1310 may include D flip-flops 1311 to 1315 connected in series. The first D flip-flop 1311 may receive the ground voltage VSS through an input terminal D thereof, and the remaining D flip-flops 1312 to 1315 may receive signals of output terminals Q of previous D flip-flops through input terminals D thereof, respectively. A shift signal SHIFT may be input to clock terminals of the D flip-flops 1311 to 1315.

When an initialization signal INI is activated, an output signal of the D flip-flop 1311 may be initialized to a low level, and the output signals TEST_CS<0:3> of the D flip-flops 1312 to 1315 may be initialized to a high level. In this state, when the shift signal SHIFT is activated, one of the output signals TEST_CS<0:3> may be sequentially activated whenever the shift signal SHIFT is activated. That is, when the shift signal SHIFT is activated for the first time, the node selection signal TEST_CS<0> may be activated, and when the shift signal SHIFT is activated for the second time, the node selection signal TEST_CS<1> may be activated. When the shift signal SHIFT is activated for the third time, the node selection signal TEST_CS<2> may be activated, and when the shift signal SHIFT is activated for the fourth time, the node selection signal TEST_CS<3> may be activated.

The voltage control signal generation units 1320, 1330, 1340 and 1350 may generate the pull-up voltage control signals H_CS<0:3> and the pull-down voltage control signals L_CS<0:3>. A high fix signal FIX_H and a low fix signal FIX_L may be signals for selecting driving levels of the nodes M_CS<0:3> (FIG. 12) having applied voltages that are determined on the basis of the pull-up voltage control signals H_CS<0:3> and the pull-down voltage control signals L_CS<0:3>. When the high fix signal FIX_H is activated, the voltage control signal generation units 1320, 1330, 1340 and 1350 may activate pull-up voltage control signals corresponding to unselected nodes among the nodes M_CS<0:3>, and when the low fix signal FIX_L is activated, the voltage control signal generation units 1320, 1330, 1340 and 1350 may activate pull-down voltage control signals corresponding to unselected nodes among the nodes M_CS<0:3>. For example, when the node selection signal TEST_CS<1> is activated and the high fix signal FIX_H is activated, the pull-up voltage control signal H_CS<1> corresponding to the selected node M_CS<1> may be deactivated and the pull-up voltage control signals H_CS<0>, H_CS<2>, and H_CS<3> corresponding to the remaining nodes M_CS<0>, M_CS<2>, and M_CS<3> may be activated. For example, when the node selection signal TEST_CS<2> is activated and the low fix signal FIX_L is activated, the pull-down voltage control signal L_CS<2> corresponding to the selected node M_CS<2> may be deactivated and the pull-down voltage control signals L_CS<0>, L_CS<1>, and L_CS<3> corresponding to the remaining nodes M_CS<0>, M_CS<1>, and M_CS<3> may be activated.

The voltage control signal generation unit 1320 may include two inverters 1321 and 1323, an OR gate 1322, and a NAND gate 1324, the voltage control signal generation unit 1330 may include two inverters 1331 and 1333, an OR gate 1332, and a NAND gate 1334, the voltage control signal generation unit 1340 may include two inverters 1341 and 1343, an OR gate 1342, and a NAND gate 1344, and the voltage control signal generation unit 1350 may include two inverters 1351 and 1353, an OR gate 1352, and a NAND gate 1354.

Figure 14:
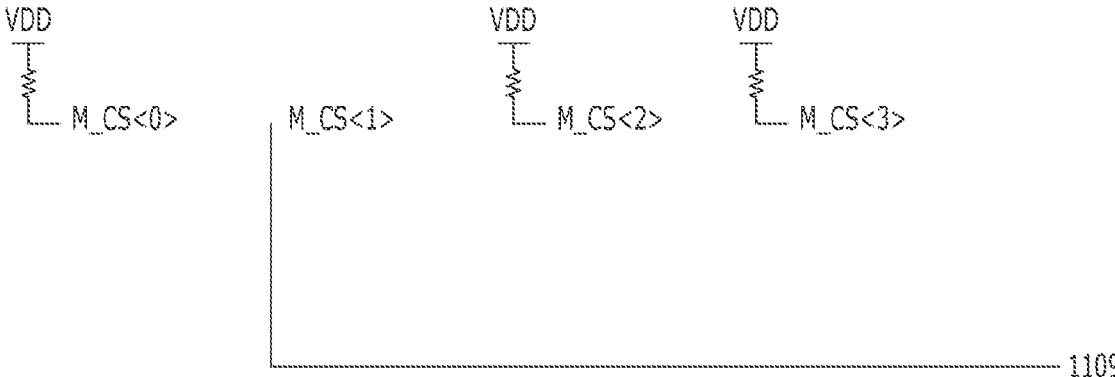
FIG. 14 is a diagram illustrating an electrical connection state between voltage application circuits 1211 to 1214 and a connection circuit 1230 of the leakage test circuit 1110 when a high fix signal FIX_H is activated and a node selection signal TEST_CS<1> is activated.

FIG. 14 is a diagram illustrating an electrical connection state between the voltage application circuits 1211 to 1214 and the connection circuit 1230 of the leakage test circuit 1110 when the high fix signal FIX_H is activated and the node selection signal TEST_CS<1> is activated.

Referring to FIG. 12 and FIG. 14 together, the voltage application circuit 1212 may float the selected node M_CS<1>, and the remaining voltage application circuits 1211, 1213, and 1214 may pull-up drive the remaining nodes M_CS<0>, M_CS<2>, and M_CS<3>. In such a case, the selected node M_CS<1> may be electrically connected to the output node 1109.

When a short circuit fault exists between the selected node M_CS<1> and the other nodes M_CS<0>, M_CS<2>, and M_CS<3>, a leakage current path may be generated from the other nodes M_CS<0>, M_CS<2>, and M_CS<3> to the selected node M_CS<1>, so that current may flow through the selected node M_CS<1>. The current of the selected node M_CS<1> can be measured using the output node 1109, and when it is checked that current flows through the output node 1109, it can be determined that a short circuit fault exists between the selected node M_CS<1> and at least one of the other nodes M_CS<0>, M_CS<2>, and M_CS<3>.

Figure 15:
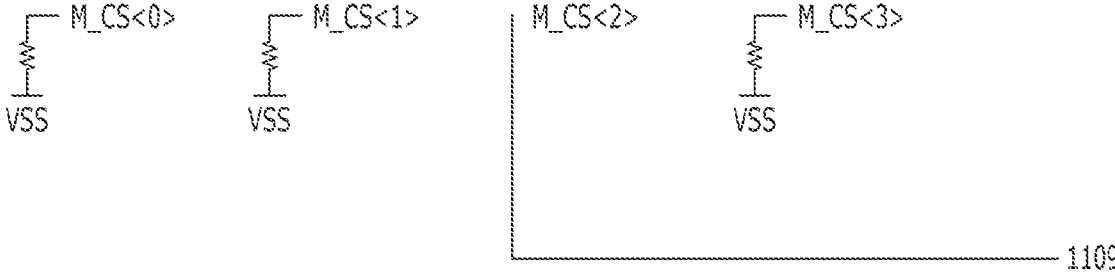
FIG. 15 is a diagram illustrating an electrical connection state between the voltage application circuits 1211 to 1214 and the connection circuit 1230 of the leakage test circuit 1110 when a low fix signal FIX_L is activated and a node selection signal TEST_CS<2> is activated.

FIG. 15 is a diagram illustrating an electrical connection state between the voltage application circuits 1211 to 1214 and the connection circuit 1230 of the leakage test circuit 1110 when the low fix signal FIX_L is activated and the node selection signal TEST_CS<2> is activated.

Referring to FIG. 12 and FIG. 15 together, the voltage application circuit 1213 may float the selected node M_CS<2>, and the remaining voltage application circuits 1211, 1212, and 1214 may pull-down drive the remaining nodes M_CS<0>, M_CS<1>, and M_CS<3>. In such a case, the selected node M_CS<2> may be electrically connected to the output node 1109.

When a short circuit fault exists between the selected node M_CS<2> and the other nodes M_CS<0>, M_CS<1>, and M_CS<3>, a leakage current path may be generated from the selected node M_CS<2> to the other nodes M_CS<0>, M_CS<1>, and M_CS<3>, so that current may flow through the selected node M_CS<2>. The current of the selected node M_CS<2> can be measured using the output node 1109, and when it is checked that current flows through the output node 1109, it can be determined that a short circuit fault exists between the selected node M_CS<2> and at least one of the other nodes M_CS<0>, M_CS<1>, and M_CS<3>.

Referring to FIG. 12 to FIG. 15, it is possible, in an embodiment, to activate the high fix signal FIX_H in order to check a leakage current path to a selected node or to activate the low fix signal FIX_L in order to check a leakage current path from a selected node, and by sequentially activating the node selection signals TEST_CS<0:3>, it may be checked that it is possible to sequentially test the presence or absence of a leakage path in the nodes M_CS<0:3>.

In FIG. 8, an embodiment in which the loopback circuit 810 is provided in the buffer chip 220 to make it possible to check whether the buffering operation of the buffer chip 220 is correctly performed has been described, and in FIG. 11, an embodiment in which the leakage test circuit 1110 is provided in the buffer chip 220 to make it possible to check the presence or absence of a leakage path in the buffer chip 220 has been described. Because the loopback circuit 810 and the leakage test circuit 1110 operate independently of each other, it is of course that the buffer chip 220 includes both the loopback circuit 810 and the leakage test circuit 1110.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A buffer chip comprising:
an external control signal interface configured to receive control signals transmitted from a memory controller;
an internal control signal interface configured to transmit the control signals to a plurality of memory chips;
an external data interface configured to transmit and receive (transmit/receive) data to and from (to/from) the memory controller;
an internal data interface configured to transmit/receive the data to/from the plurality of memory chips; and
a loopback circuit configured to be activated in a loopback mode to receive the control signals transmitted by the internal control signal interface, and to transmit the control signals to the external data interface.

2. The buffer chip of claim 1, wherein, in the loopback mode, the external data interface transmits the control signals transmitted from the loopback circuit to the memory controller.

3. The buffer chip of claim 2, wherein the loopback circuit comprises:
a loopback reception circuit configured to receive the control signals transmitted by the internal control signal interface;
a loopback selection circuit configured to select a part of the control signals received by the loopback reception circuit; and
a mode control circuit configured to transmit the control signals selected by the loopback selection circuit to the external data interface during activation of a loopback mode signal, and to transmit the data received by the internal data interface to the external data interface during deactivation of the loopback mode signal.

4. The buffer chip of claim 1, further comprising:
a control signal transmission circuit configured to buffer the control signals received through the external control signal interface and to transmit the buffered control signals to the internal control signal interface;
a command decoder configured to decode the control signals received through the external control signal interface;
a setting circuit configured to perform a setting operation according to a decoding result of the command decoder and to control the setting of the loopback mode;
a latency control circuit configured to control activation and deactivation of the external data interface and the internal data interface during a write operation and a read operation, and to activate the external data interface in the loopback mode;
a clock reception circuit configured to receive a clock from the memory controller;
a clock transmission circuit configured to transmit the clock received by the clock reception circuit to the plurality of memory chips;
an external alert signal interface configured to transmit/receive an alert signal to/from the memory controller; and
an internal alert signal interface configured to transmit/receive the alert signal to/from the memory chips.

5. The buffer chip of claim 4, wherein the loopback circuit comprises:
a loopback reception circuit configured to receive the control signals transmitted by the internal control signal interface, the clock transmitted by the clock transmission circuit, and the alert signal transmitted by the internal alert signal interface;

a loopback selection circuit configured to select a part of the signals received by the loopback reception circuit; and a mode control circuit configured to transmit the signals selected by the loopback selection circuit to the external data interface during activation of a loopback mode signal, and to transmit the data received by the internal data interface to the external data interface during deactivation of the loopback mode signal.

6. The buffer chip of claim 5, wherein the loopback circuit further comprises:

a reference voltage generation circuit configured to generate reference voltages to be used by the loopback reception circuit.

7. The buffer chip of claim 1, wherein the control signals include chip select signals and command address signals.

8. A semiconductor package comprising:

a package substrate including a plurality of terminals configured to communicate with a memory controller and a plurality of bonding pads configured to communicate inside a package;

a buffer chip disposed on the package substrate;

a plurality of memory chips stacked on the buffer chip; and a plurality of wires connecting the plurality of bonding pads and the plurality of memory chips, wherein the buffer chip communicates with the memory controller through the plurality of terminals of the package substrate, wherein the plurality of memory chips communicate with the buffer chip through the plurality of wires and the plurality of bonding pads of the package substrate, and wherein the buffer chip comprises:

an external control signal interface configured to receive control signals transmitted from the memory controller;

an internal control signal interface configured to transmit the control signals to the plurality of memory chips;

an external data interface configured to transmit and receive (transmit/receive) data to and from (to/from) the memory controller;

an internal data interface for configured to transmit/ receive the data to/from the plurality of memory chips; and a loopback circuit configured to be activated in a loopback mode to receive the control signals transmitted by the internal control signal interface, and to transmit the control signals to the external data interface.

9. The semiconductor package of claim 8, wherein, in the loopback mode, the external data interface transmits the control signals transmitted from the loopback circuit to the memory controller.

10. A memory module comprising:

a module controller including a host interface for communication with a host, a memory controller logic for memory control, and a memory interface for transmission of control signals and the transmission and reception (transmission/reception) of data;

a buffer chip configured to receive the control signals from the memory interface and to transmit and receive (transmit/receive) the data to and from (to/from) the memory interface; and a plurality of memory chips configured to receive the control signals through the buffer chip and to transmit/ receive the data through the buffer chip, wherein the buffer chip comprises:

an external control signal interface configured to receive control signals transmitted from the memory controller;

an internal control signal interface configured to transmit the control signals to the plurality of memory chips;

an external data interface configured to transmit/receive data to/from the memory controller;

an internal data interface for configured to transmit/ receive the data to/from the plurality of memory chips; and a loopback circuit configured to be activated in a loopback mode to receive the control signals transmitted by the internal control signal interface, and to transmit the control signals to the external data interface.

11. The memory module of claim 10, wherein the loopback circuit comprises:

a loopback reception circuit configured to receive the control signals transmitted by the internal control signal interface;

a loopback selection circuit configured to select a part of the control signals received by the loopback reception circuit; and a mode control circuit configured to transmit the control signals selected by the loopback selection circuit to the external data interface during activation of a loopback mode signal, and to transmit the data received by the internal data interface to the external data interface during deactivation of the loopback mode signal.

* * * * *